United States Patent
Kobayashi et al.

(10) Patent No.: US 8,325,259 B2
(45) Date of Patent: Dec. 4, 2012

(54) PHOTOELECTRIC CONVERSION APPARATUS AND METHOD SETTING A REVERSE BIAS VOLTAGE VALUE OF A PHOTOELECTRIC CONVERSION ELEMENT LARGER THAN A DEPLETING VOLTAGE OF THE PHOTOELECTRIC CONVERSION ELEMENT

(75) Inventors: Hideo Kobayashi, Tokyo (JP);
Tomohisa Kinugasa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 451 days.

(21) Appl. No.: 12/628,422

(22) Filed: Dec. 1, 2009

(65) Prior Publication Data
US 2010/0165161 A1 Jul. 1, 2010

(30) Foreign Application Priority Data
Dec. 25, 2008 (JP) .................... 2008-330804

(51) Int. Cl.
*H04N 3/14* (2006.01)
*H04N 5/335* (2006.01)
(52) U.S. Cl. .................... 348/302; 348/311
(58) Field of Classification Search ............... 348/294, 348/302, 308, 311; 257/432
See application file for complete search history.

(56) References Cited

U.S. PATENT DOCUMENTS

| 4,634,883 | A | * | 1/1987 | Nishiura et al. | 358/482 |
| 5,132,759 | A | * | 7/1992 | Honjoh et al. | 257/432 |
| 6,300,615 | B1 | | 10/2001 | Shinohara et al. | 250/214 R |
| 2005/0117041 | A1 | * | 6/2005 | Tsukamoto | 348/294 |
| 2009/0295974 | A1 | * | 12/2009 | Koizumi et al. | 348/311 |

FOREIGN PATENT DOCUMENTS

| JP | 06-098080 | 4/1994 |
| JP | 2000-077644 | 3/2000 |

* cited by examiner

*Primary Examiner* — Gevell Selby
(74) *Attorney, Agent, or Firm* — Fitzpatrick, Cella, Harper & Scinto

(57) ABSTRACT

A photoelectric conversion apparatus includes: a first photoelectric conversion element generating a current by photoelectric conversion; a first current amplifying element for amplifying the current generated by the first photoelectric conversion element; a first detecting unit for detecting a reverse bias voltage value of the first photoelectric conversion element; and a first setting unit for setting the reverse bias voltage value of the first photoelectric conversion element at a first normal value based on a result of the detection by the first detecting unit, wherein the first normal value is larger than a depleting voltage of the first photoelectric conversion element.

18 Claims, 11 Drawing Sheets

COMMON SOURCE CIRCUIT

COMMON SOURCE CIRCUIT

PHOTOELECTRIC CONVERSION APPARATUS AND METHOD SETTING A REVERSE BIAS VOLTAGE VALUE OF A PHOTOELECTRIC CONVERSION ELEMENT LARGER THAN A DEPLETING VOLTAGE OF THE PHOTOELECTRIC CONVERSION ELEMENT

BACKGROUND OF THE INVENTION

1. Field of the Invention

The present invention relates to a photoelectric conversion apparatus.

2. Description of the Related Art

Japanese patent Application Laid-Open No. 2000-077644 relates to a conventional photoelectric conversion apparatus which is used for an AE (Auto Exposure: automatic exposure) sensor or an AF (Auto Focus: automatic focus) sensor to be used in a single-lens reflex camera and employs a phototransistor, for instance. Hereafter, a field effect transistor is referred to as an FET. The photoelectric conversion apparatus has a common source circuit which includes a constant current source and an MOSFET that is driven by the constant current source, and attempts to enhance the photoresponsibility by maintaining a base potential of a phototransistor almost constant, which is determined by a voltage applied between a gate and a source of the MOSFET. When the quantity of incident light changes, the collector current of the phototransistor changes, so the voltage between the base and the emitter of the phototransistor changes. A potential which mainly varies at this time is not the base potential of the phototransistor, but the emitter potential and a potential of the gate of the MOSFET whose source is connected to the emitter. This is because when the photo current varies and the base potential varies, the output of the common source circuit, in other words, the gate potential of the MOSFET whose source is connected to the emitter largely varies, and the emitter potential largely varies at the same time. In this way, the variation of the base potential can be inhibited to be extremely small by feedback applied from the emitter. As a result, the photoelectric conversion apparatus shortens the period of time necessary for charging a capacitance between the base and the collector to achieve improvement in photoresponsibility, even in the case where the phototransistor has a large area and the capacitance between the base and the collector is large.

In addition, Japanese patent Application Laid-Open No. H06-098080 discloses the structure of a photodiode which has been completely depleted.

However, when the area of a phototransistor increases in order to enhance the sensitivity of the pixel of a sensor, the photoresponsibility deteriorates after all by the increase of the capacitance between the base and the collector.

One of the reasons is that when the capacitance between the base and the collector increases, it takes time to charge the capacitance between the base and the collector, even when the variation of the base potential is small.

The variation of the base potential is a value obtained by dividing the variation of the gate potential of the MOSFET whose source is connected to the emitter of the phototransistor by a gain of the common source circuit, and depends on the variate of the incident light, but is typically as small as approximately several mV to a dozen or so mV. However, when the capacitance between the base and the collector is large, it takes time to vary the potential of such a small degree, which influences the photoresponsibility.

Another reason is that when the capacitance between the base and the collector increases, the capacitance between the base and the collector works as a capacitance of a low pass filter at the time when the feedback is applied from the emitter to the base, which delays the feedback.

The above-described capacitance between the base and the collector is mainly formed from a capacitance of a depletion layer in a junction between the base and the collector. There is a technique for completely depleting a photoelectric conversion region, as a general technique for reducing the capacitance of the depletion layer. Even when the photoelectric conversion region has a large area, the capacitance of the depletion layer associated with the photoelectric conversion region can be inhibited to be almost zero by the complete depletion in the photoelectric conversion region. However, because the capacitance of the depletion layer depends on a reverse bias voltage, when the reverse bias voltage to be applied to the photoelectric conversion region varies due to the variation of the photo current in a period while the photoelectric conversion apparatus operates, a parasitic capacitance to be added to the photoelectric conversion region changes according to the operating state. For instance, when the reverse bias voltage varies and falls to a depleting voltage of the photoelectric conversion region or lower, the parasitic capacitance rapidly increases, and the photoresponsibility deteriorates.

For this reason, the present invention is directed at providing a photoelectric conversion apparatus which inhibits the variation of a parasitic capacitance of a photoelectric conversion element according to the operating state to maintain a state in which the parasitic capacitance is small, and thereby can provide a state in which the photoresponsibility is stably satisfactory.

SUMMARY OF THE INVENTION

A photoelectric conversion apparatus according to the present invention includes: a first photoelectric conversion element generating a current by a photoelectric conversion; a first current amplifying element for amplifying the current generated by the first photoelectric conversion element; a first detecting unit for detecting a reverse bias voltage value of the first photoelectric conversion element; and a first setting unit for setting the reverse bias voltage value of the first photoelectric conversion element at a first normal value based on a result of the detection by the first detecting unit, wherein the first normal value is larger than a depleting voltage of the first photoelectric conversion element.

Further features of the present invention will become apparent from the following description of exemplary embodiments with reference to the attached drawings.

The accompanying drawings, which are incorporated in and constitute a part of the specification, illustrate embodiments of the invention and, together with the description, serve to explain the principles of the invention.

DESCRIPTION OF THE EMBODIMENTS

Preferred embodiments of the present invention will now be described in detail in accordance with the accompanying drawings.

First Embodiment

Figure 1:
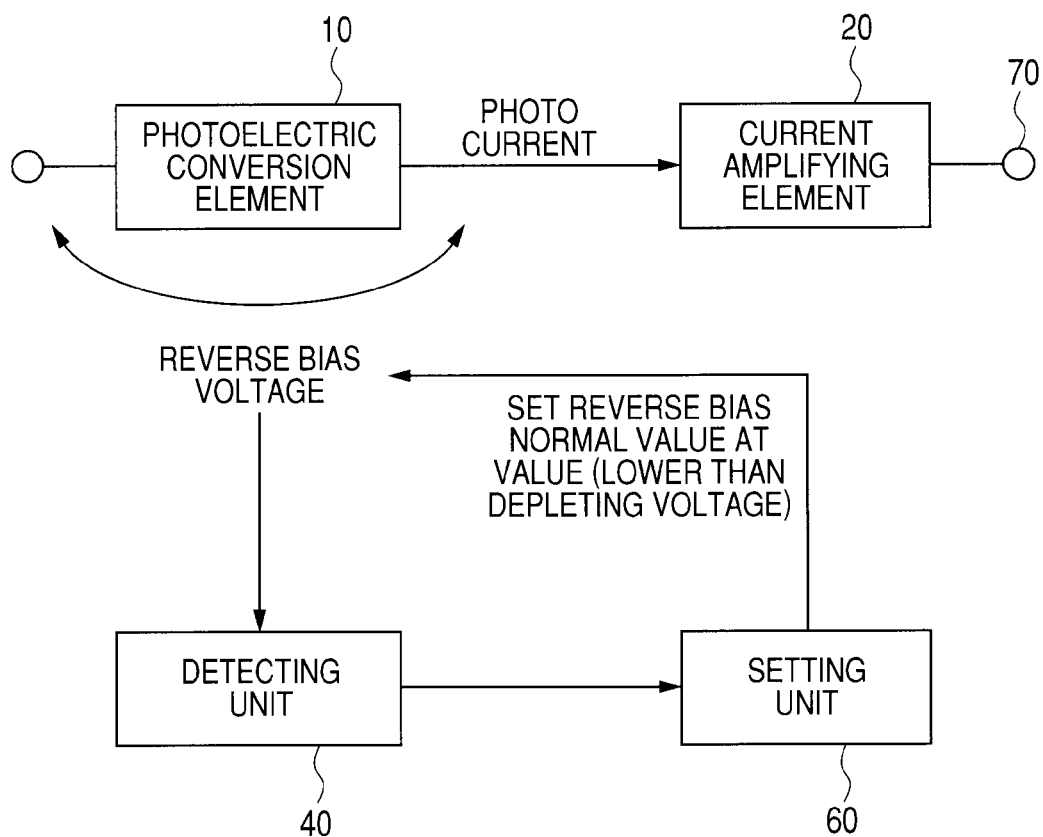
FIG. 1 is a schematic view illustrating a configuration of an example of a photoelectric conversion apparatus according to a first embodiment of the present invention.

FIG. 1 is a schematic view illustrating a configuration of an example of a photoelectric conversion apparatus according to a first embodiment of the present invention. The photoelectric conversion apparatus includes a photoelectric conversion element 10 which converts an optical signal to an electric signal, a current amplifying element 20 which amplifies a photo current generated in the photoelectric conversion element 10, and a current output terminal 70 which outputs the output current amplified by the current amplifying element 20. The photoelectric conversion apparatus also includes a detecting unit 40 which detects a reverse bias voltage applied to the photoelectric conversion element 10, and a setting unit 60 which sets the reverse bias voltage to be applied to both ends of the photoelectric conversion element 10 at a normal value based on a detected result in the detecting unit 40.

The detecting unit 40 always monitors the reverse bias voltage value applied to the both ends of the photoelectric conversion element 10, and sends the result to the setting unit 60. When the reverse bias value detected in the detecting unit 40 is different from the normal value, the setting unit 60 works so as to set the reverse bias voltage at the normal value. Here, the normal value is set larger than a depleting voltage of the photoelectric conversion element 10, and then, the reverse bias voltage to be applied to the photoelectric conversion element 10 can be stably kept at the depleting voltage or larger. As a result, the setting unit inhibits the variation of a parasitic capacitance of the photoelectric conversion element 10 according to the operating state to maintain a state in which the parasitic capacitance is small, and thereby can maintain a state in which the photoresponsibility is stably satisfactory.

Figure 2:
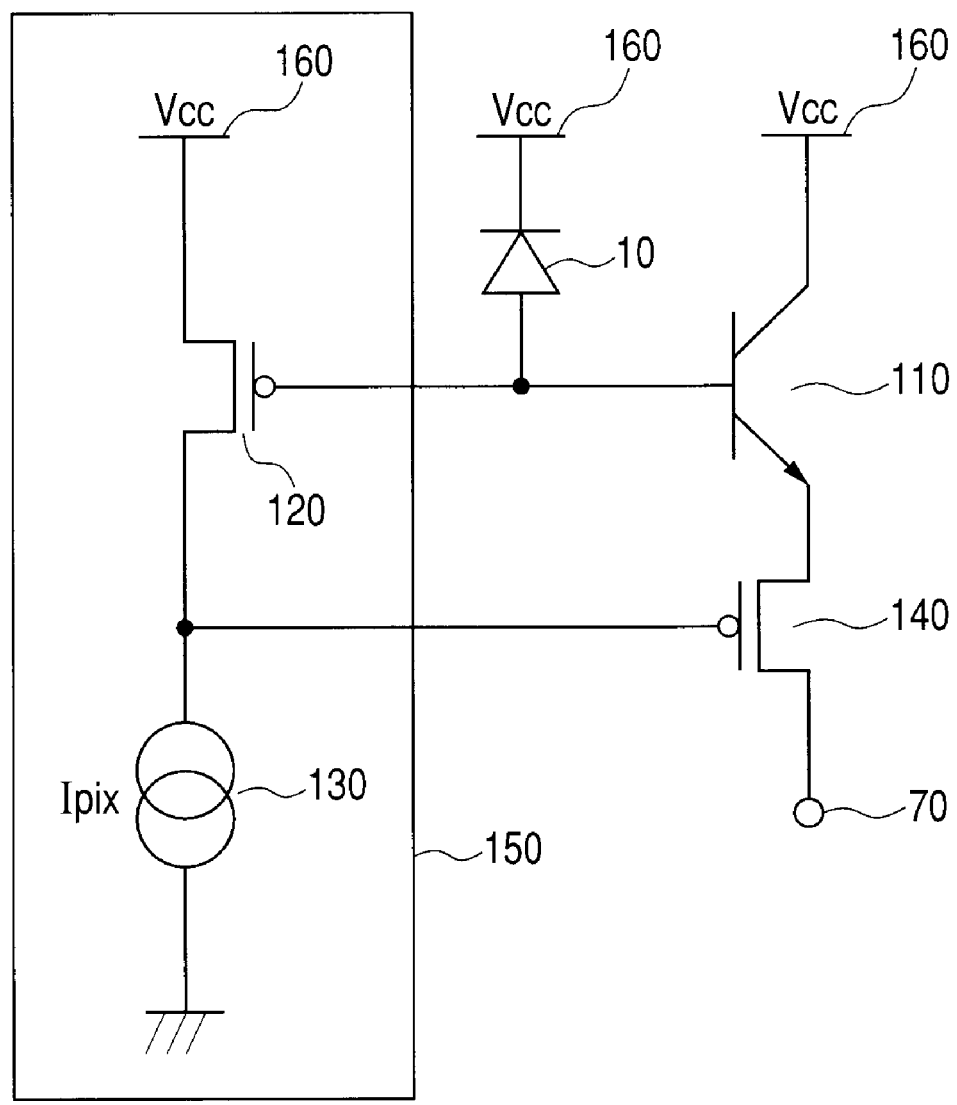
FIG. 2 is a circuit diagram illustrating the configuration of an example of the photoelectric conversion apparatus according to the first embodiment of the present invention.

FIG. 2 is a circuit diagram illustrating the configuration of an example of the photoelectric conversion apparatus according to the present embodiment. The photoelectric conversion apparatus includes a photoelectric conversion element 10 and a bipolar transistor 110 which amplifies the photo current generated in the photoelectric conversion element 10. The photoelectric conversion apparatus also includes a common source circuit 150. The common source circuit 150 includes a first MOSFET 120 whose gate is connected to the base of the bipolar transistor 110, and a constant current source 130 which drives the first MOSFET 120. The photoelectric conversion apparatus also includes a second MOSFET 140 whose gate is connected to the drain of the first MOSFET 120, and whose the source is connected to the emitter of the bipolar transistor 110, and which outputs the photo current amplified by the bipolar transistor 110 from the drain. A node 160 of a power source voltage Vcc and a current output terminal 70 are also shown.

The cathode of the photoelectric conversion element (photodiode) 10 is connected to the power source voltage node 160. In the P-channel MOSFET 120, the source is connected to the power source voltage node 160, and the gate is connected to the anode of the photoelectric conversion element 10. The constant current source 130 is connected in the way between the drain of the P-channel MOSFET 120 and the reference voltage (ground potential) node. In the NPN bipolar transistor 110, the collector is connected to the power source voltage node 160, and the base is connected to the anode of the photoelectric conversion element 10. In the P-channel MOSFET 140, the source is connected to the emitter of the NPN bipolar transistor 110, the gate is connected to the drain of the P-channel MOSFET 120, and the drain is connected to the current output terminal 70.

Here, the bipolar transistor 110 corresponds to the current amplifying element 20 of FIG. 1, the common source circuit 150 corresponds to the detecting unit 40 of FIG. 1, and the second MOSFET 140 corresponds to the setting unit 60 of FIG. 1. The operation of the circuit of FIG. 2 will be described below.

The relationship between an electric current passing through a constant current source 130, in other words, an electric current $I_{pix}$ passing through a first MOSFET 120, and a voltage $V_{gs}$ between a gate and a source is expressed by the following expression (1).

$$I_{pix} = \frac{\beta}{2}(V_{gs} - V_{th})^2 \tag{1}$$

Here, $V_{gs}$ represents a voltage between a gate and a source of the MOSFET, and $V_{th}$ represents a threshold voltage of the MOSFET. In addition, $\beta$ is expressed by the following expression (2).

$$\beta = \mu_0 C_{ox} \frac{W}{L} \tag{2}$$

Here, $\mu_0$ represents a mobility of a carrier, $C_{ox}$ represents a gate capacitance per unit area of the MOSFET, W represents a gate width of the MOSFET, and L represents a gate length of the MOSFET.

Voltage $V_{gs}$ between the gate and the source is introduced from the expression (1) to be expressed by the following expression (3).

$$V_{gs} = V_{th} + \sqrt{\frac{2 I_{pix}}{\beta}} \quad (3)$$

This value consequently represents the reverse bias voltage of a photoelectric conversion element 10, and corresponds to the normal value in FIG. 1. Accordingly, the photoelectric conversion element 10 can be depleted by designing the depleting voltage VDEP of the photoelectric conversion element 10, the gate size and threshold voltage of the first MOSFET 120, and the current value of the constant current source 130 so as to satisfy the following expression (4).

$$V_{th} + \sqrt{\frac{2 I_{pix}}{\beta}} > VDEP \quad (4)$$

For instance, when the photo current generated in the photoelectric conversion element 10 increases and the base potential of the bipolar transistor 110 rises, a common source circuit 150 detects the variation and lowers the gate potential of the second MOSFET 140. In response to this operation, the source potential of the second MOSFET 140, in other words, the emitter potential of the bipolar transistor 110 decreases, and feedback is applied from the emitter to keep the base potential of the bipolar transistor 110 approximately at an original value. When the photo current decreases, a reverse feedback is applied to keep the base potential of the bipolar transistor 110 approximately at the original value.

Accordingly, the reverse bias voltage applied to the photoelectric conversion element 10 can be stably kept at a depleting voltage or higher by designing the values so as to satisfy the expression (4). As a result, the common source circuit can always maintain' the capacitance between the base and the collector of the bipolar transistor 110 at a small value, and can reduce the period of time necessary for charging the capacitance between the base and the collector when the quantity of light varies. The common source circuit also can reduce the influence on the delay of the feedback due to the capacitance between the base and the collector when the feedback is applied to the base from the emitter.

In this way, the photoelectric conversion apparatus according to the present embodiment inhibits the variation of the parasitic capacitance of the photoelectric conversion element 10 according to the operating state to maintain a state in which the parasitic capacitance is small, and thereby can provide a state in which the photoresponsibility is stably satisfactory.

The reason why the above-described effect can be obtained in the present embodiment is that the photoelectric conversion apparatus according to the present embodiment is a current readout type. It is difficult to obtain the above-described effect in a charge readout type, for instance, in a photoelectric conversion apparatus in which a photoelectric conversion element is connected directly to an input gate of a source follower. The charge readout type of a photoelectric conversion apparatus accumulates the generated charge in a photoelectric conversion element, so the reverse bias voltage of the photoelectric conversion element surely varies according to the accumulated amount of electric charges. Accordingly, even though the photoelectric conversion element was depleted by the reverse bias voltage of the depleting voltage or higher applied thereto when the photoelectric conversion element is reset, the parasitic capacitance of the photoelectric conversion element increases when the reverse bias voltage falls to the depleting voltage or lower due to the charge accumulation. Therefore, the charge readout type of a photoelectric conversion apparatus cannot inhibit the variation of the parasitic capacitance according to the operating state. From the above reason, it can be said that the photoelectric conversion apparatus according to the present embodiment can provide the above-described effect precisely because of being a current readout type which always continues to read out the photo current generated in the photoelectric conversion element.

Second Embodiment

Figure 3:
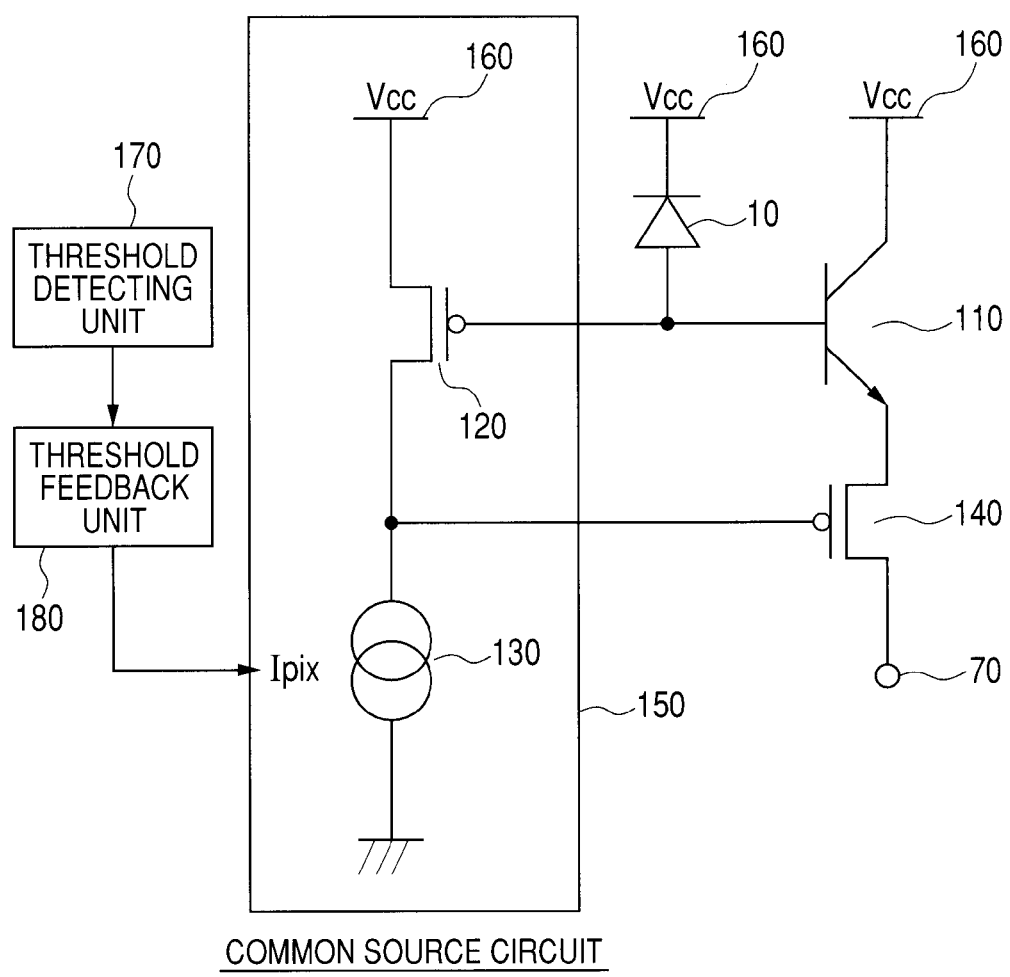
FIG. 3 is a schematic view illustrating a configuration of an example of a photoelectric conversion apparatus according to a second embodiment of the present invention.

FIG. 3 is a view illustrating a configuration of an example of a photoelectric conversion apparatus according to a second embodiment of the present invention. However, here, only points different from those in the above described first embodiment will be described.

A point in FIG. 3, which is different from that in the embodiment of FIG. 2, is that a threshold detecting unit 170 is provided therein which detects a threshold voltage $V_{th}$ of an MOSFET having the same polarity as a first MOSFET 120. Furthermore, a threshold feedback unit 180 is provided therein which feeds back a result detected in the threshold detecting unit 170 to an electric current value in a constant current source 130. As a result, the photoelectric conversion apparatus can easily maintain' the reverse bias voltage applied to the photoelectric conversion element 10 at a larger voltage than a depleting voltage, even when the threshold voltage $V_{th}$ of the first MOSFET 120 varies due to fluctuations in manufacture.

The followings are understood from the expression (4). The variation in the left-hand side of the expression (4) due to a variation of a threshold voltage, in other words, the variation of the reverse bias voltage can be reduced by applying feedback to an electric current value so that the current value $I_{pix}$ increases when the threshold voltage $V_{th}$ has decreased and so that the current value $I_{pix}$ decreases when the threshold voltage $V_{th}$ has increased.

As a result, even when the threshold voltage $V_{th}$ of the first MOSFET 120 varies due to a fluctuation in manufacture, the reverse bias voltage applied to the photoelectric conversion element 10 can be easily maintained larger than the depleting voltage. The operation will be described in detail below with reference to the circuit configuration illustrated in FIG. 4.

Figure 4:
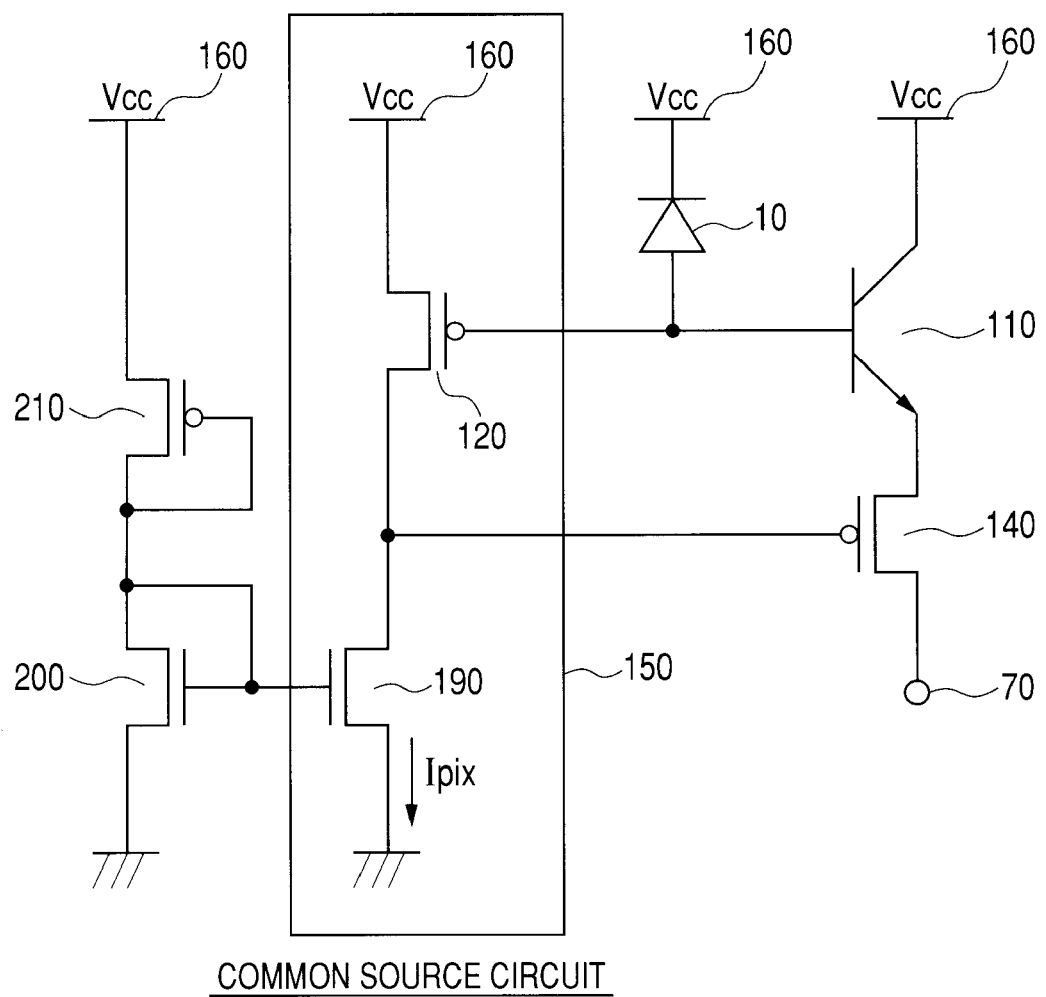
FIG. 4 is a circuit diagram illustrating the configuration of an example of the photoelectric conversion apparatus according to the second embodiment of the present invention.

In FIG. 4, the constant current source 130 includes a third MOSFET 190 and a fourth MOSFET 200 having a polarity different from the first MOSFET 120. The threshold detecting unit 170 of FIG. 3 and the threshold feedback unit 180 include a fifth MOSFET 210 having the same polarity as the first MOSFET 120.

In FIG. 4, it is assumed for simplification that the threshold voltage $V_{th}$ of the first MOSFET 120 is equal to that of the fifth MOSFET 210, and β determined by the expression (2) in the third MOSFET 190 and the fourth MOSFET 200 is equally $β_n$. In addition, the threshold voltage $V_{thn}$ of the third MOSFET 190 is equal to that of the fourth MOSFET 200, and $β_n$ determined by the expression (2) of the third MOSFET 190 is equal to that of the fourth MOSFET 200. At this time, in FIG. 4, the expression (1) holds in the fifth MOSFET 210 and the fourth MOSFET 200, and the electric current passing through the third MOSFET 190 is equal to that passing through the fourth MOSFET 200, so $I_{pix}$ is expressed by the following expression (5).

$$I_{pix} = \frac{1}{2}\left(\frac{V_{CC} - V_{th} - V_{thn}}{\frac{1}{\sqrt{\beta}} + \frac{1}{\sqrt{\beta_n}}}\right)^2 \qquad (5)$$

It is understood from the expression (5) that the $I_{pix}$ increases when the $V_{th}$ decreases, and that the $I_{pix}$ decreases when the $V_{th}$ increases. Accordingly, the photoelectric conversion apparatus according to the present embodiment can reduce the variation of the left-hand side in the expression (4), in other words, the variation of the reverse bias voltage.

As a result, the photoelectric conversion apparatus can easily maintain' the reverse bias voltage applied to the photoelectric conversion element 10 larger than a depleting voltage, even when the process has varied.

Third Embodiment

Figure 5:
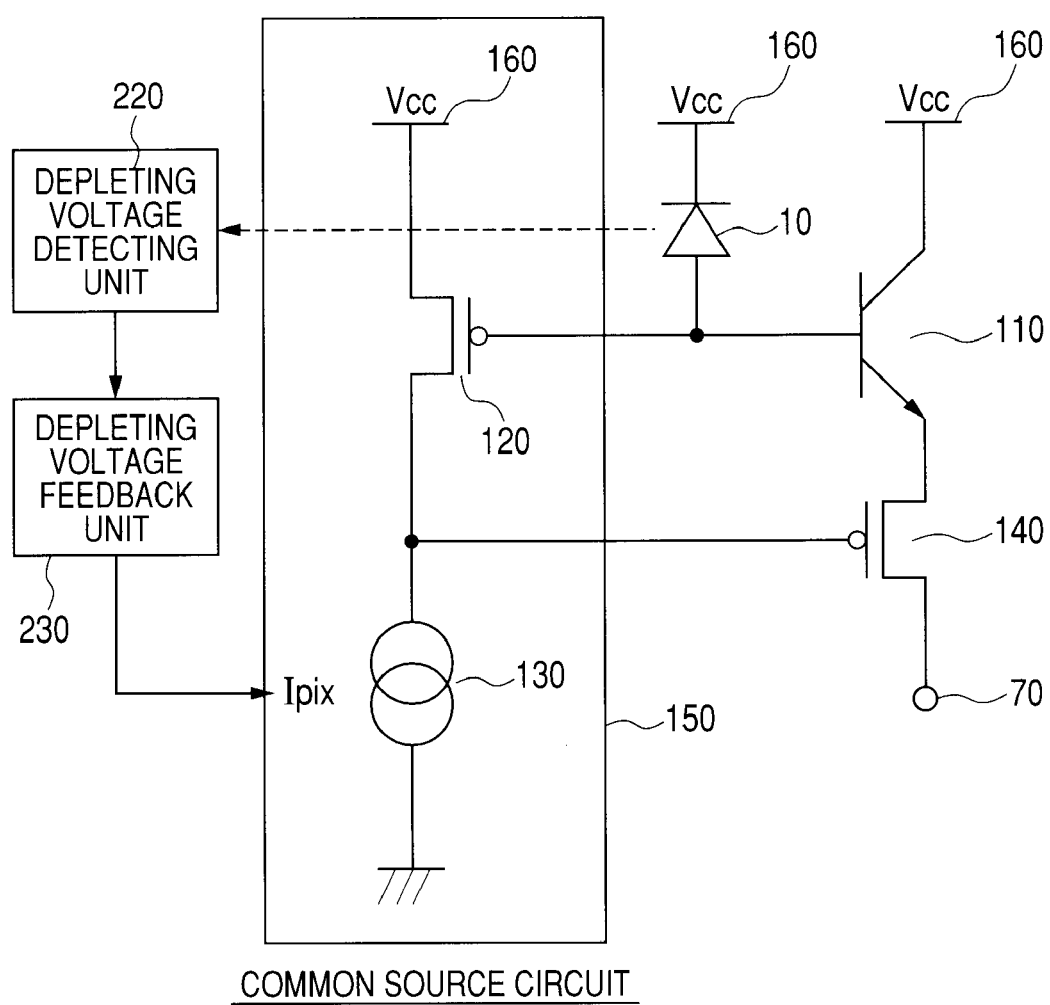
FIG. 5 is a schematic view illustrating a configuration of an example of a photoelectric conversion apparatus according to a third embodiment of the present invention.

FIG. 5 is a view illustrating a configuration example of a photoelectric conversion apparatus according to a third embodiment of the present invention. However, here, only points different from those in the above described first embodiment will be described.

A point different from that in the embodiment of FIG. 2 is that a depleting voltage detecting unit 220 is provided therein which detects a depleting voltage of the photoelectric conversion element 10. Furthermore, a depleting voltage feedback unit 230 is provided therein which feeds back a result detected in the depleting voltage detecting unit 220 to an electric current value of the constant current source 130. As a result, the photoelectric conversion apparatus can easily maintain' the reverse bias voltage applied to the photoelectric conversion element 10 larger than the depleting voltage, even when the process has varied.

The depleting voltage detecting unit 220 detects an increase in the depleting voltage due to a process variation, and the depleting voltage feedback unit 230 applies feedback to the constant current source 130 so as to increase the current value thereof. At this time, as is understood from the expression (4), even when the depleting voltage VDEP increases due to a process variation, the value in the left-hand side of the expression (4) increases along with the increase of the depleting voltage VDEP, so the reverse bias voltage applied to the photoelectric conversion element 10 can be easily kept larger than the depleting voltage.

Fourth Embodiment

Figure 6:
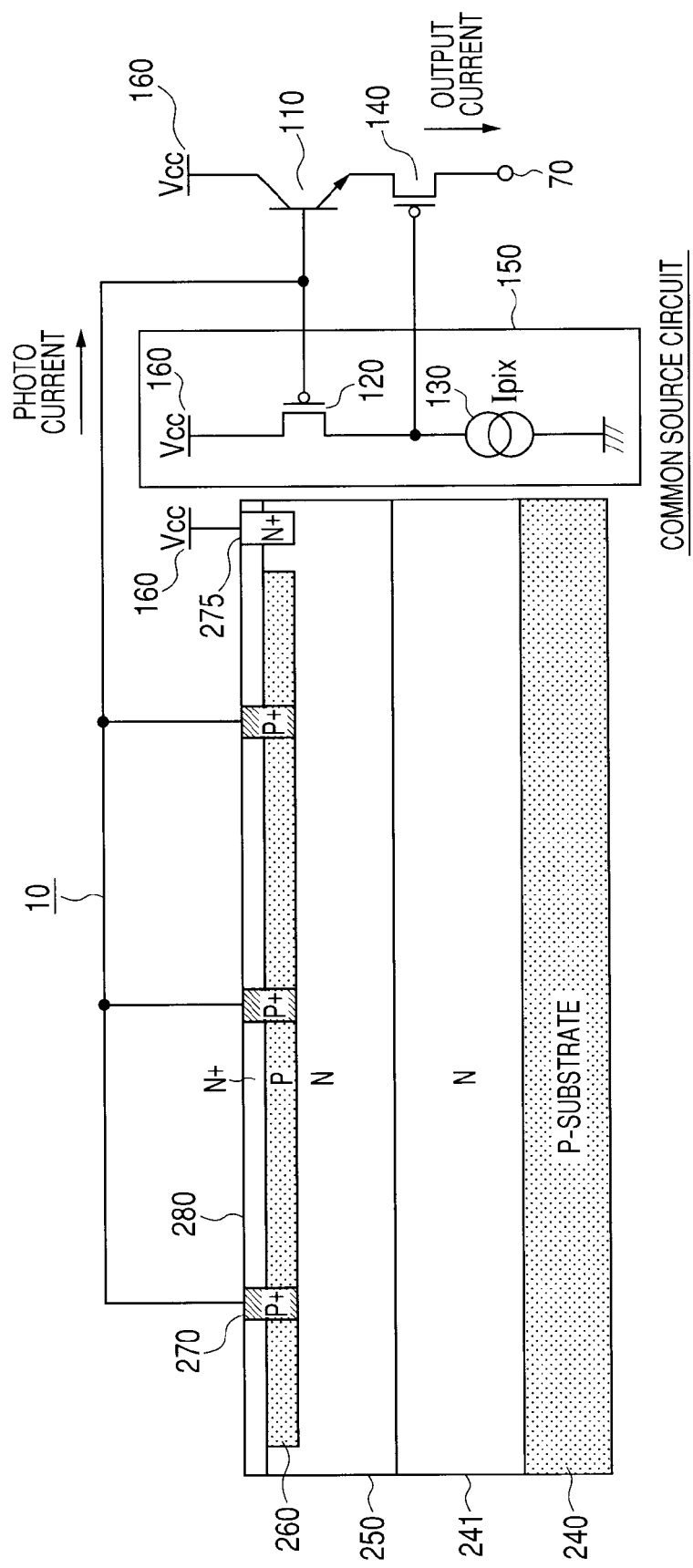
FIG. 6 is a schematic view illustrating a configuration of an example of a photoelectric conversion apparatus according to a fourth embodiment of the present invention.
Figure 7:
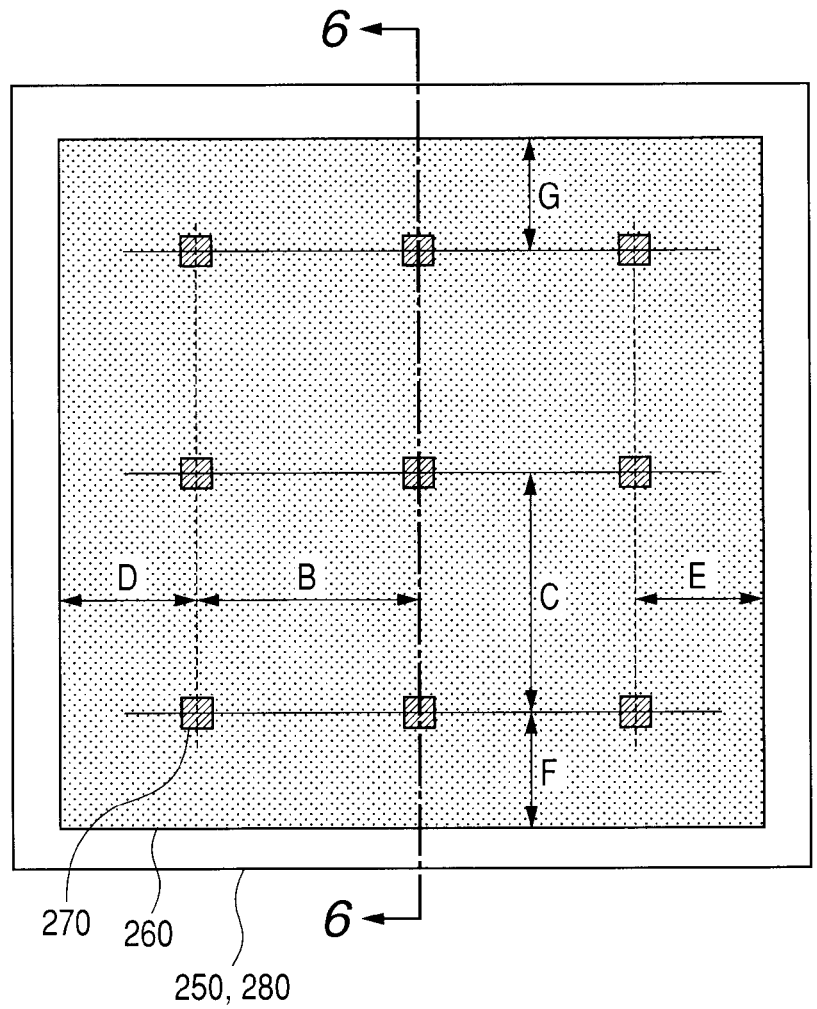
FIG. 7 is a schematic view illustrating the configuration of an example of the photoelectric conversion apparatus according to the fourth embodiment of the present invention.

FIG. 6 and FIG. 7 are views illustrating a configuration of an example of a photoelectric conversion apparatus according to a fourth embodiment of the present invention. However, here, only points different from those in the above-described first embodiment will be described.

The point will now be described with reference to FIG. 6. A P type silicon substrate 240 is shown. An N type epitaxial layer 241 having an impurity concentration of $2 \times 10^{15}$ atoms/cm$^3$ is formed on the P type silicon substrate 240. An N type region 250 having a peak impurity concentration of $3 \times 10^{17}$ atoms/cm$^3$ is formed on the N type epitaxial layer 241. In addition, a surface N$^+$ region 280 having a peak impurity concentration of $1 \times 10^{18}$ atoms/cm$^3$ is formed on the surface. In addition, a P type contact portion 270 is connected with the base of a bipolar transistor 110 and has a peak impurity concentration of $8 \times 10^{19}$ atoms/cm$^3$. An N type contact portion 275 has high impurity concentration. A P type region 260 which becomes the photoelectric conversion region has a peak impurity concentration of $3 \times 10^{17}$ atoms/cm$^3$. Carriers generated in the P type region 260 flow to the base of the bipolar transistor 110 through the contact portion 270. In this way, the photoelectric conversion element 10 includes the N type region 250, the P type region 260, the surface N$^+$ region 280 and the contact portion 270; and has a plurality of contact portions 270 provided therein.

FIG. 7 illustrates a plan view of the photoelectric conversion element 10 of FIG. 6, and a broken line taken along the line 6-6 of FIG. 7 corresponds to a sectional view of the photoelectric conversion element 10 of FIG. 6. It can be understood from FIG. 7 that the P type region 260 has a plurality of lines and rows of contact portions 270 provided therein. B denotes the pitch in a row direction of the matrix of the contact portions 270, C denotes the pitch in the line direction, each of D and E denotes the distance between a row belonging to the outermost periphery and the end of the P type region 260, and each of F and G denotes the distance between a line belonging to the outermost periphery and the end of the P type region 260.

The depleting voltage of the photoelectric conversion element 10 is determined by relationships among concentrations of the N type region 250, the P type region 260 and the surface N$^+$ region 280. As was described above, the P type region 260 can be stably depleted by designing the depleting voltage of the photoelectric conversion element 10, the gate size and threshold voltage of a first MOSFET 120, and the electric current value of a constant current source 130 so as to satisfy the expression (4). As a result, the photoelectric conversion apparatus can always maintain' the capacitance between the base and the collector of the bipolar transistor 110 at a small value, and reduce the period of time necessary for charging the capacitance between the base and the collector. The photoelectric conversion apparatus also can reduce the influence on the delay of the feedback due to the capacitance between the base and the collector when the feedback is applied to the base from the emitter. That is to say, such a state that the output current quickly varies after the photo current has varied in FIG. 6 can be stably obtained. Accordingly, such a state that the photoresponsibility is stably satisfactory can be obtained.

However, when the depleted semiconductor layer (hereafter referred to as the depleted layer) is used as the photoelectric conversion region as in FIG. 6, the diffusion rate of the carrier in the depleted layer can be the dominant influence on the photoresponsibility, though this depends on a size of the depleted layer. Specifically, not the period of time to be spent before the output current varies after the photo current has varied, but the period of time spent before the carrier reaches the contact portion after the quantity of light has varied can be the dominant influence.

The undesirable influence on the photoresponsibility due to carrier diffusion delay can be inhibited by providing a plurality of contact portions 270 at this time, as in FIG. 6, thereby shortening the diffusion length of the carrier in the depleted layer.

However, the contact portion 270 can be a factor increasing the dark current flowing from the surface, so it is desirable to arrange a minimum necessary number of the contact portions in such a range that the diffusion length of the carrier can be effectively short.

One desirable arranging method is a method of providing a plurality of lines and rows of contact portions 270 as in FIG. 7, and selecting the line number and the row number of the contact portions 270 so that the pitch in the line direction and the pitch in the row direction can be approximately 1:1. Specifically, B:C≈1:1, in FIG. 7. It is inefficient for an arranging method to densely arrange the contact portions 270 only in the row direction, for instance, because the pitch in the line direction remains long and consequently the diffusion length in the line direction remains long.

In addition, it is further desirable that the distance between the contact portion 270 in the outermost periphery and the end of the P type region 260 is approximately half of the pitch between the contact portions 270, in FIG. 7. Specifically, B≈2×D≈2×E, and C≈2×F≈2×G, in FIG. 7. As a result, a part having a long diffusion length can be prevented from being formed in the vicinity of the outer periphery of the P type region 260.

When the contact portions 270 are arranged as described above in FIG. 7, the longest diffusion length for the carrier is expressed by the following expression (6).

$$\text{longest diffusion length} = \sqrt{\left(\frac{\text{pitch in the line direction}}{2}\right)^2 + \left(\frac{\text{pitch in the row direction}}{2}\right)^2} \quad (6)$$

$$= \sqrt{\left(\frac{B}{2}\right)^2 + \left(\frac{C}{2}\right)^2}$$

Figure 8:
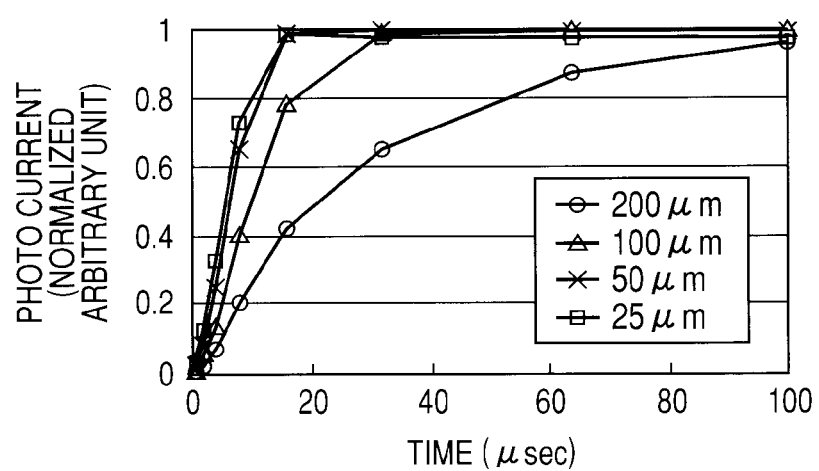
FIG. 8 is a view illustrating a simulation result of a waveform of a photo current flowing when the photoelectric conversion element of FIG. 6 is irradiated with a light.

FIG. 8 shows the result of having run a simulation of a rising wave form of a photo current in the cases where the diffusion lengths determined by the expression (6) are 25 μm, 50 μm, 100 μm and 200 μm respectively. The horizontal axis represents a period of time and the vertical axis represents the photo current. Light starts irradiating the photoelectric conversion element of FIG. 6 at the time of 0 μsec of the horizontal axis. Light irradiates the element with an illuminance of approximately 3.6 (1×). It is understood that when the diffusion length is 25 μm or 50 μm, the photo current rises in approximately 15 μsec, but that in the case of 100 μm, a delay of approximately 15 μsec occurs before the photo current rises because the diffusion of the carrier is retarded and a period of time of 30 μsec or longer is needed, in FIG. 8. For instance, an AE sensor used in an imaging system is required to have a photoresponsibility of approximately 10 μsec to 100 μsec before the output current rises after the sensor has been irradiated with light, in FIG. 6. Accordingly, the delay of approximately 15 μsec having occurred before the photo current rises when the diffusion length is 100 μm in FIG. 8 causes a significant difference, and is a bad influence on the photoresponsibility of an illuminance sensor. Therefore, it is desirable to set the longest diffusion length determined by the expression (6) at approximately 50 μm or shorter.

When the longest diffusion length is 50 μm in FIG. 7, the pitch in the line direction and the pitch in the row direction are each 70 μm approximately, when the pitch in the line direction is equal to the pitch in the row direction. When the size of the contact portion 270 is set at 2 μm$^2$, for instance, the total area of the contact portions 270 is as extremely small as approximately 0.08% of the area of the P type regions 260. Therefore, the influence of the provided plurality of the contact portions 270 on an increase in the dark current can be extremely small.

In the present embodiment, the case was taken as an example, in which the line number and the row number of the contact portions 270 were 3, but the case is not limited to the example.

It is possible as was described above to inhibit the undesirable influence on the photoresponsibility of carrier diffusion delay while also inhibiting an increase in the dark current, by arranging a minimum necessary number of the contact portions 270 so that the diffusion length of the carrier can be effectively short.

Fifth Embodiment

Figure 9:
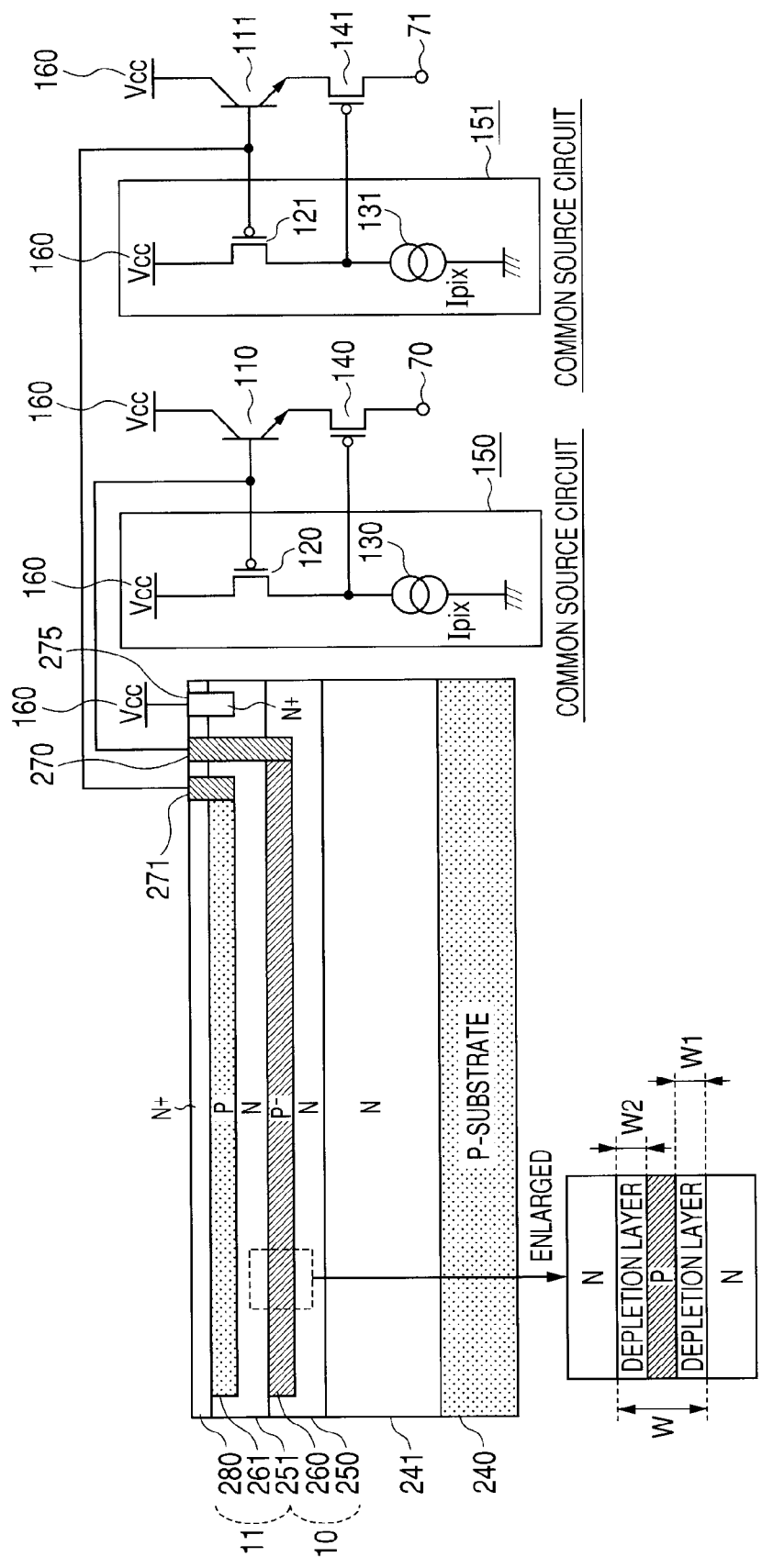
FIG. 9 is a schematic view illustrating a configuration of an example of a photoelectric conversion apparatus according to a fifth embodiment of the present invention.

FIG. 9 is a view illustrating a configuration of an example of the photoelectric conversion apparatus according to a fifth embodiment of the present invention. However, here, only points different from those in the above-described first embodiment will be described.

In FIG. 9, a P type silicon substrate 240 and an N type epitaxial layer 241 are shown. N type regions and P type regions are alternately stacked such as an N type region 250, a P type region 260, an N type region 251, a P type region 261 and a surface N$^+$ region 280, and the P type regions 260 and 261 are formed in different depths, respectively. The longer the wavelength of light incident on the silicon layers, the more deeply it penetrates into the layers, so light signals with respect to light having different wavelength bands can be obtained from the P type regions 260 and 261. In this way, the photoelectric conversion element 10 is formed of the N type region 250, the P type region 260 and the N type region 251, the photoelectric conversion element 11 is formed of the N type region 251, the P type region 261 and the surface N$^+$ region 280, and the photoelectric conversion elements 10 and 11 are stacked in a depth direction.

A common source circuit 151 includes a first MOSFET 121 and a constant current source 131 while corresponding to the common source circuit 150. The first MOSFET 121 and the constant current source 131 correspond to the first MOSFET 120 and the constant current source 130, respectively. A bipolar transistor 111 corresponds to the bipolar transistor 110, a second MOSFET 141 corresponds to the second MOSFET 140, and a current output terminal 71 corresponds to the current output terminal 70.

A cathode of a photoelectric conversion element (photodiode) 11 is connected to a power source voltage node 160. In the P-channel MOSFET 121, the source is connected to the power source voltage node 160, and the gate is connected to the anode of the photoelectric conversion element 11. The constant current source 131 is connected in the way between the drain of the P-channel MOSFET 121 and the reference voltage (ground potential) node. In the NPN bipolar transistor 111, the collector is connected to the power source voltage node 160, and the base is connected to the anode of the photoelectric conversion element 11. In the P-channel MOSFET 141, the source is connected to the emitter of the NPN bipolar transistor 111, the gate is connected to the drain of the P-channel MOSFET 121, and the drain is connected to the current output terminal 71.

In addition, contact portions 270 and 271 are provided in the P type regions 260 and 261 respectively, and are connected to the bipolar transistors 110 and 111, respectively. As a result, the bipolar transistors 110 and 111 are structured so as to amplify respective photo currents and output the respective photo currents from the respective current output terminals 70 and 71. Here, the P type regions 260 and 261 can be stably depleted by designing the photoelectric conversion elements 10 and 11, the first MOSFETs 120 and 121, and the constant current sources 130 and 131 so as to satisfy the expression (4), for each of the photoelectric conversion elements 10 and 11. Then, the photoelectric conversion apparatus inhibits the variation of the parasitic capacitance of the photoelectric conversion elements 10 and 11 in FIG. 9 according to the operating state to maintain a state in which the parasitic capacitances in the photoelectric conversion elements 10 and 11 are small, and thereby can provide a state in which the photoresponsibility is stably satisfactory.

In such a photoelectric conversion apparatus, the optimal reverse bias voltage can be set so as to fit each of the photoelectric conversion elements 10 and 11. As a result, the photoelectric conversion apparatus can easily maintain' the reverse bias voltage applied to the respective photoelectric conversion elements 10 and 11 larger than the respective depleting voltages, even when the fluctuations in manufacture have occurred.

In the photoelectric conversion elements 10 and 11 of FIG. 9, the photoelectric conversion element 10 which has been formed in a deeper position generally causes larger fluctuations of the depleting voltage due to its manufacture than the photoelectric conversion element 11. This point will now be described below.

As is illustrated in FIG. 9, the width of the P type region 260 in the depth direction shall be represented by W. In addition, the lengths of the depletion layers extending from the N type regions 250 and 251 toward the P type region 260 shall be represented by W1 and W2, respectively. Here, it shall be assumed for simplification that the impurity concentration in the N type region 250=impurity concentration in the N type region 251>>impurity concentration in the P type region 260 holds, and then the following expression (7) holds.

$$W1 = W2 \approx \sqrt{\frac{2\varepsilon(V_{bi} + V_R)}{eN_A}} \quad (7)$$

Here, $\varepsilon$ represents the dielectric constant of silicon, $V_{bi}$ represents an integrated potential which is determined by the impurity concentrations of a P type region 260 and an N type region, $V_R$ represents the reverse bias voltage which has been applied between the P type region 260 and the N type region, and $N_A$ represents the impurity concentration in the P type region 260. In expression (7), when $V_R$ reaches the depleting voltage VDEP, W=W1+W2 holds, and the P type region 260 is completely depleted. Accordingly, the following expression (8) holds.

$$W = 2\sqrt{\frac{2\varepsilon(V_{bi} + VDEP)}{eN_A}} \quad (8)$$

As is understood from the expression (8), the distributions of the width W of the P type region 260 in the depth direction and the impurity concentration $N_A$ in the P type region 260 contribute to the distributions of the depleting voltage VDEP.

In both cases where an impurity region is formed by thermal diffusion and where an impurity region is formed by ion implantation, the impurity region formed down to a deeper position from the surface generally shows a concentration profile of impurities in the depth direction having a wider full width at half maximum, and shows a wide-based shape. Accordingly, in FIG. 9, the photoelectric conversion element 10 is formed by a conjugation of a P type impurity profile and an N type impurity profile having wider full widths at half maximums than the photoelectric conversion element 11. At this time, the distributions of the width W of the P type region 260 in the depth direction and the impurity concentration $N_A$ in the P type region 260 due to the distribution of the impurity profile shape originating in the process are larger than those in the P type region 261. Accordingly, the photoelectric conversion element 10 causes larger fluctuations of the depleting voltage in manufacture than the photoelectric conversion element 11, according to the expression (8).

In other words, the fluctuations of the depleting voltage in the manufacture of the photoelectric conversion element 11 are smaller than those of the photoelectric conversion element 10. Accordingly, the reverse bias voltage of the photoelectric conversion element determined by the expression (3) can be made to be relatively small, so $I_{pix}$ can be made to be small. That is to say, the photoelectric conversion apparatus can be driven at the minimum necessary consumption current by selecting the optimum $I_{pix}$ suitable for each of the photoelectric conversion elements 10 and 11.

In the present embodiment, the case was taken as an example, in which the number of the photoelectric conversion elements stacked in the depth direction was 2, but the case is not limited to this example.

In this way, the photoelectric conversion apparatus according to the present embodiment, which has stacked the photoelectric conversion elements 10 and 11 that are operated after having been depleted in the depth direction, can reduce the electric current consumption by optimizing the reverse bias voltage to be applied to each of the photoelectric conversion elements 10 and 11.

Sixth Embodiment

Figure 10:
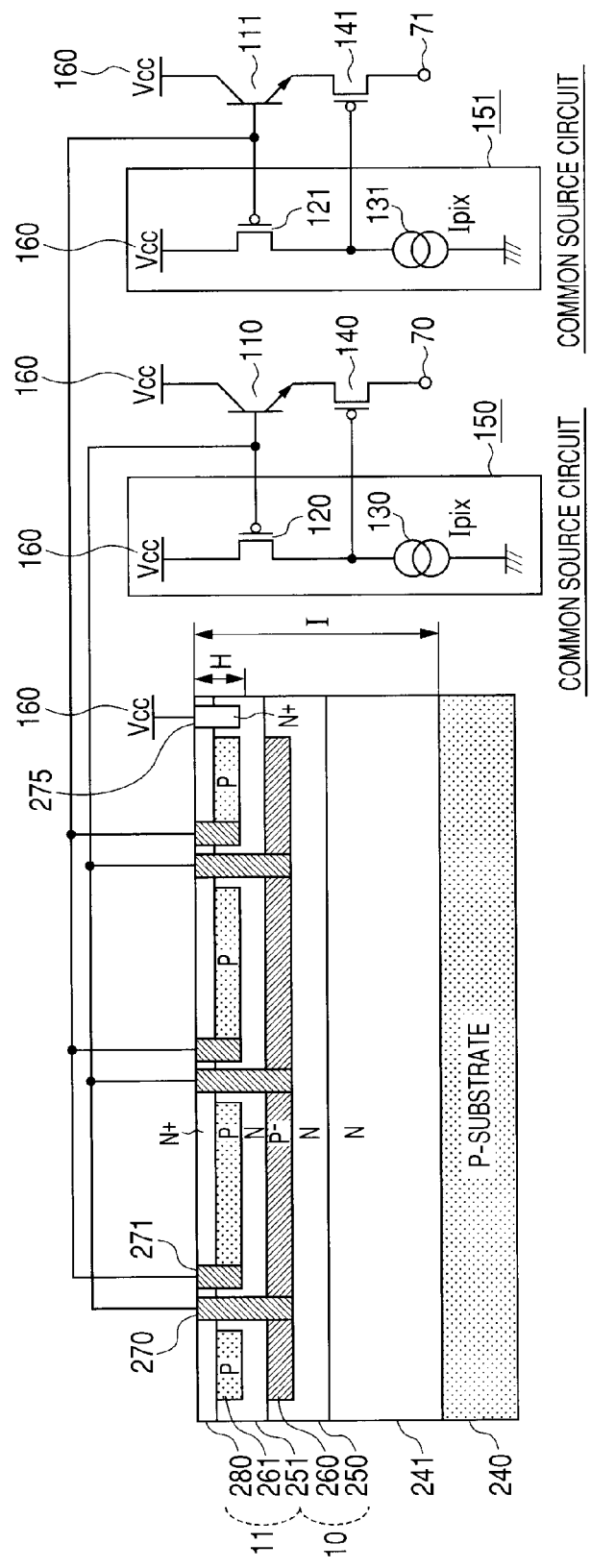
FIG. 10 is a schematic view illustrating a configuration of an example of a photoelectric conversion apparatus according to a sixth embodiment of the present invention.
Figure 11:
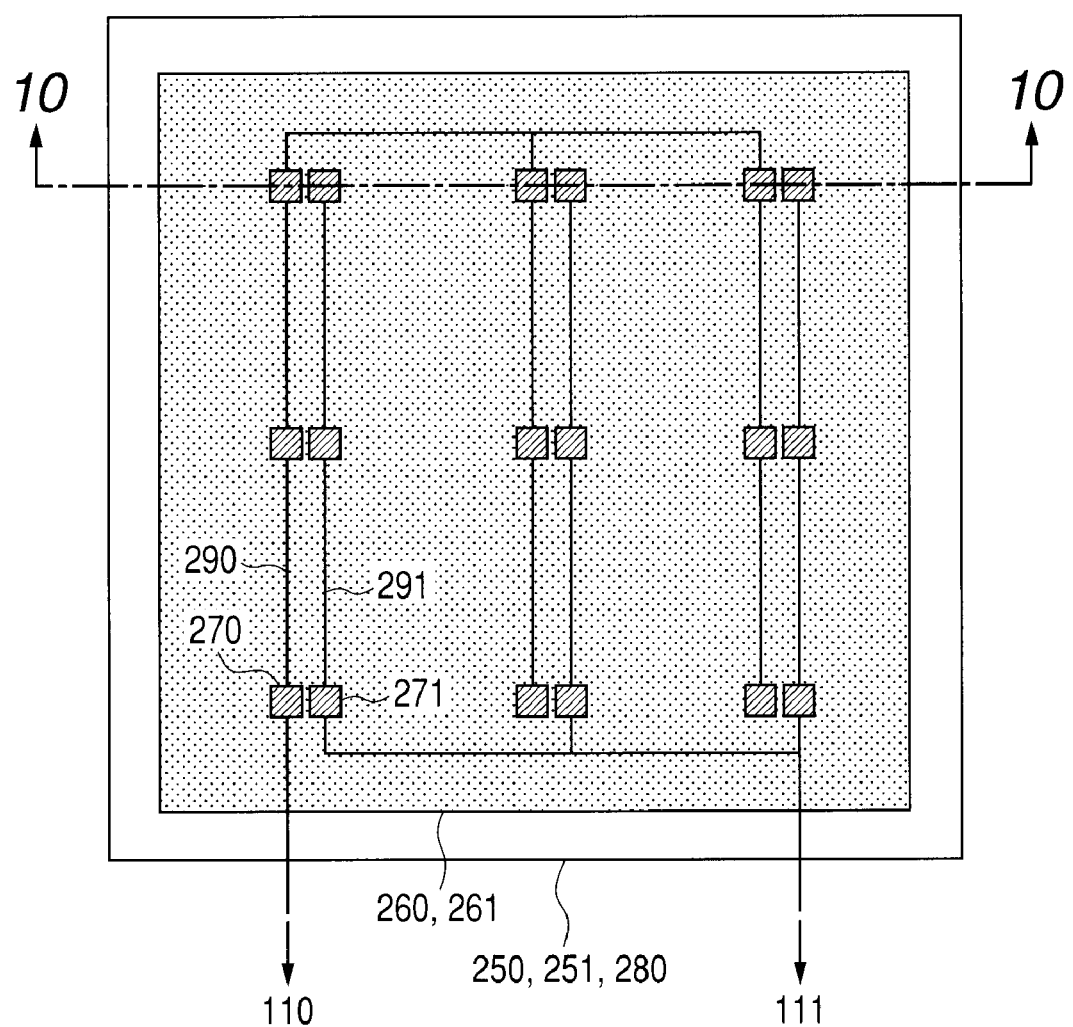
FIG. 11 is a schematic view illustrating the configuration of an example of the photoelectric conversion apparatus according to the sixth embodiment of the present invention.

FIGS. 10 and 11 are views illustrating a configuration example of a photoelectric conversion apparatus according to a sixth embodiment of the present invention. However, here, only points different from those in the above-described fifth embodiment will be described.

In FIG. 10, a plurality of contact portions 270 is provided in the P type region 260, and a plurality of contact portions 271 is provided in the P type region 261. FIG. 11 illustrates a plan view of the photoelectric conversion elements 10 and 11 of FIG. 10, and a broken line taken along the line 10-10 of FIG. 11 corresponds to a sectional view of FIG. 10. According to FIGS. 10 and 11, a plurality of lines and rows of contact portions 270 are provided in the P type region 260, and a plurality of lines and rows of contact portions 271 are provided in the P type region 261. The contact portions 270 and the contact portions 271 are connected respectively with metal wires 290 and 291 which are arranged so as to form a comb shape and be telescopic with respect to each other. Thus configured, the photoelectric conversion apparatus can inhibit the decrease of the opening area of the photoelectric conversion elements 10 and 11, and can inhibit the aggravation of the photoresponsibility because of an increase of the parasitic capacitance to be formed in the base of the bipolar transistors 110 and 111. The photoelectric conversion apparatus also can inhibit each of the photoelectric conversion elements 10 and 11 from undesirably influencing the photoresponsibility due to a delay in carrier diffusion in the photoelectric conversion region, similarly in the fourth embodiment.

In FIG. 11, a number of patterns can be considered when connecting the contact portions 270 and the contact portions 271 with the metal wires 290 and 291, though the number of the patterns depends on the line number and the row number of the contact portions. However, the most desirable connection pattern is a pattern in which each length of the metal wires 290 and 291 becomes shortest. This is because as the length of the wiring becomes longer, the effective opening areas of the photoelectric conversion elements 10 and 11 become smaller, and the parasitic capacitances to be formed in the bases of the bipolar transistors 110 and 111 become larger due to the parasitic capacitances to be formed in the wires. The increase of the parasitic capacitance causes the aggravation of the photoresponsibility, as was described above. Therefore, the contact portions 270 and the contact portions 271 are desirably connected so that each length of the wires becomes shortest, by using metal wires 290 and 291 which are arranged so as to form a comb shape and be telescopic with respect to each other, as is illustrated in FIG. 11.

In the present embodiment, the case was taken as an example, in which the row numbers and the line numbers of the contact portions 270 and the contact portions 271 were each 3, but the case is not limited to the example.

In addition, in the present embodiment, the case was taken as an example, in which the upward and downward comb-shaped wires are arranged so as to be telescopic for the metal wires 290 and 291, but the case is not limited to the example. For instance, by arranging wires which form a comb shape leftward and rightward, so as to be telescopic, a similar effect can be obtained.

The photoelectric conversion apparatus according to the present embodiment configured in this way can inhibit the decrease of the opening area of the photoelectric conversion element, and can inhibit the aggravation of the photoresponsibility due to the increase in the parasitic capacitance to be formed in the wires.

Seventh Embodiment

Figure 12:
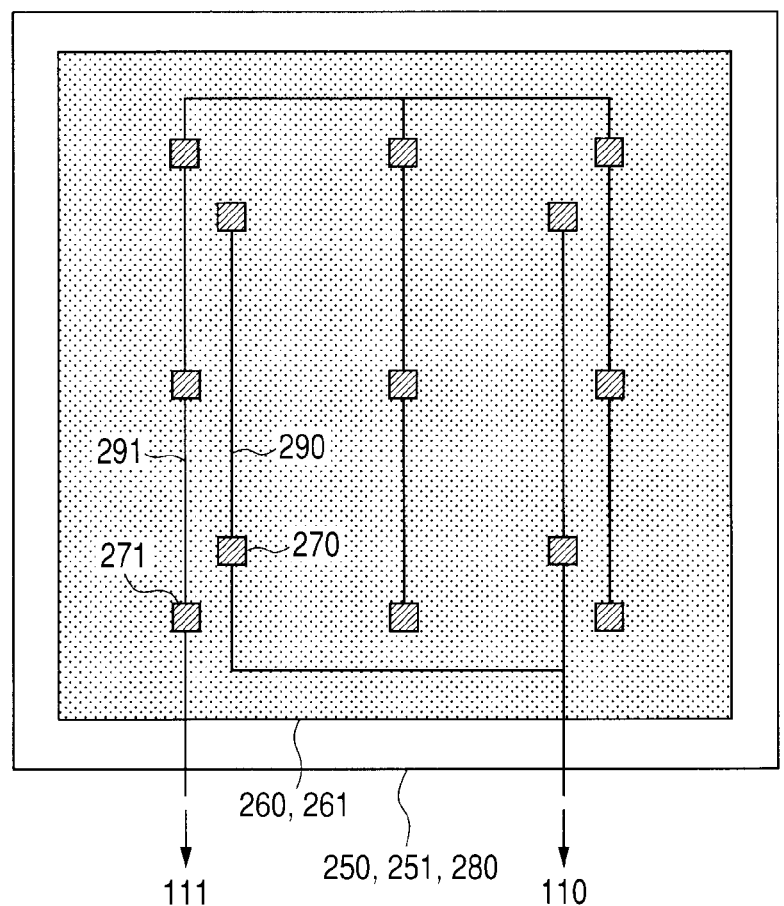
FIG. 12 is a schematic view illustrating a configuration of an example of a photoelectric conversion apparatus according to a seventh embodiment of the present invention.

FIG. 12 is a view illustrating a configuration example of a photoelectric conversion apparatus according to a seventh embodiment of the present invention. However, here, only points different from those in the above described sixth embodiment will be described.

FIG. 12 illustrates a plan view of the photoelectric conversion elements 10 and 11, similarly in FIG. 11, but the number of the contact portions 270 is smaller than that of the contact portions 271. In addition, the cross section is also similar to that in the cross section part in FIG. 10, except that the number of the contact portions 270 is small. Thus configured, the photoelectric conversion apparatus can inhibit each of the photoelectric conversion elements 10 and 11 from undesirably influencing the photoresponsibility due to a carrier diffusion delaying in the photoelectric conversion region, and can inhibit the increase of a dark current due to the contact portions compared to the sixth embodiment.

Figure 13:
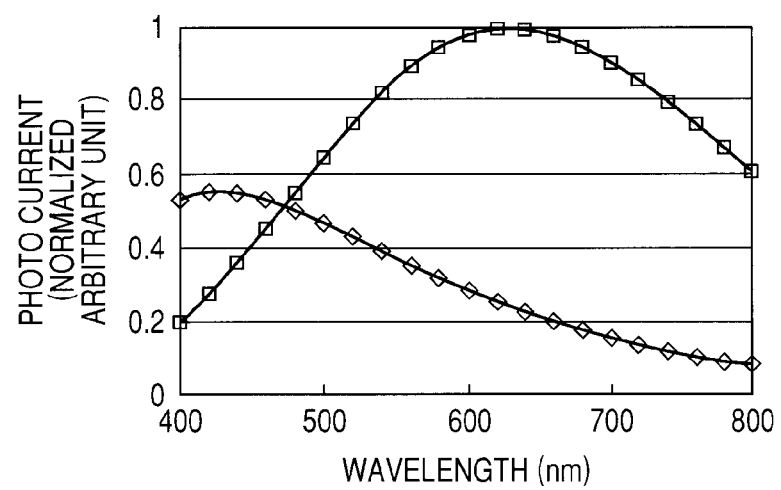
FIG. 13 is a view illustrating a simulation result of spectral characteristics of the photoelectric conversion apparatus illustrated in FIG. 10.

In FIG. 10, H represents a position of the peak in an impurity profile of an N type region 251, and I represents the total thickness of a semiconductor layer formed on a P type silicon substrate 240. The spectral characteristics of the photoelectric conversion elements 10 and 11 are mainly determined by the two factors. FIG. 13 illustrates a simulation result of the spectral characteristics when H and I are approximately 0.4 µm and 4.5 µm respectively, for instance. In FIG. 13, the horizontal axis represents the wavelength of irradiating light, and the vertical axis represents a photo current obtained by each of the photoelectric conversion elements 10 and 11. The photoelectric conversion element 11 shows characteristics having a peak in the vicinity of approximately 400 nm of the wavelength, and the photoelectric conversion element 10 shows characteristics having a peak in the vicinity of approximately 600 nm. In the case of the spectral characteristics as in FIG. 13, the photoelectric conversion element 10 can provide a larger photo current than the photoelectric conversion element 11, with respect to a light source having almost any spectral characteristics. Accordingly, the photoelectric conversion element 10 can better reduce the period of time necessary for charging the capacitor existing between the base and the collector of the bipolar transistor 110, and accordingly shows more adequate photoresponsibility. For this reason, the photoelectric conversion element 10 can provide a similar degree of photoresponsibility to that of the photoelectric conversion element 11, even when the number of the contact portions 270 is made to be smaller than that of the contact portions 271; and also can inhibit the increase of a dark current due to the increase of the contact portions.

In the present embodiment, the case was taken as an example, in which the line number and the row number of the contact portions 270 were each 2, and the line number and the row number of the contact portions 271 were each 3, but the case is not limited to the example.

In this way, the photoelectric conversion apparatus according to the present embodiment can inhibit each of the photoelectric conversion elements 10 and 11 from undesirably influencing the photoresponsibility due to a carrier diffusion delay in the photoelectric conversion region, and can inhibit the increase of a dark current due to the contact portions compared to the sixth embodiment.

Until now, the embodiments were described while taking the case of having employed a hole-collecting type as a photoelectric conversion element and an NPN bipolar transistor as an electric current amplifying element, as an example, but the case is not limited to the example. Even when the photoelectric conversion apparatus has employed an electron collecting type as the photoelectric conversion element and a PNP bipolar transistor as the electric current amplifying element, the photoelectric conversion apparatus can show the similar effect by adopting a similar configuration.

The photoelectric conversion apparatuses according to the first to seventh embodiments include a photoelectric conversion element having a large area. The embodiments can provide a photoelectric conversion apparatus which inhibits the variation of a parasitic capacitance of a photoelectric conversion element according to the operating state to maintain a state in which the parasitic capacitance is small, and thereby can provide a state in which the photoresponsibility is stably satisfactory.

In the photoelectric conversion apparatus of FIG. 1, the first photoelectric conversion element 10 generates an electric current by photoelectric conversion. The first current amplifying element 20 amplifies the electric current generated in the first photoelectric conversion element 10. The first detecting unit 40 detects a reverse bias voltage value of the first photoelectric conversion element 10. The first setting unit 60 sets the reverse bias voltage value of the first photoelectric conversion element 10 at a first normal value based on a detected result in the first detecting unit 40. The first normal value is larger than the depleting voltage of the first photoelectric conversion element 10.

In the photoelectric conversion apparatus of FIG. 2, the first current amplifying element 20 includes a first bipolar transistor 110 which connects the first photoelectric conversion element 10 to the way between its collector and base, and outputs an amplified electric current from its emitter. The first detecting unit 40 includes a first field effect transistor 120, and a first constant current source 130 which is connected to the first field effect transistor 120. In the first field effect transistor 120, the gate is connected to the base of the first bipolar transistor 110, and the source is connected to the collector of the first bipolar transistor 110. The first setting unit 60 includes a second field effect transistor 140 having the same polarity as the first field effect transistor 120. The second field effect transistor 140 has its source connected to the emitter of the first bipolar transistor 110, has its gate connected to the drain of the first field effect transistor 120, and outputs the electric current amplified by the first bipolar transistor 110 from its drain. The voltage between the gate and the source of the first field effect transistor 120 is larger than a depleting voltage of the first photoelectric conversion element 10.

In the photoelectric conversion apparatus of FIG. 3, a threshold detecting unit 170 detects the threshold voltage of the field effect transistor having the same polarity of the first field effect transistor 120. A threshold feedback unit 180 controls an electric current value of the first constant current source 130 based on a detection result in the threshold detecting unit 170.

In the photoelectric conversion apparatus of FIG. 4, the first constant current source 130 includes a third field effect transistor 190 and a fourth field effect transistor 200. The third field effect transistor 190 has its drain connected to the drain of the first field effect transistor 120. The fourth field effect transistor 200 has its interconnection point between its gate and drain connected to the gate of the third field effect transistor 190, and its source connected to the source of the third field effect transistor 190. The threshold detecting unit 170 and the threshold feedback unit 180 include a fifth field effect transistor 210. The fifth field effect transistor 210 has its interconnection point between its gate and drain connected to the gate of the fourth field effect transistor 200, and its source connected to a constant voltage node 160.

In the photoelectric conversion apparatus of FIG. 5, a depleting voltage detecting unit 220 detects a depleting voltage of the first photoelectric conversion element 10. A depleting voltage feedback unit 230 controls an electric current value of the first constant current source 130 based on a detected result in the depleting voltage detecting unit 220.

In the photoelectric conversion apparatus of FIG. 6 and FIG. 7, the first photoelectric conversion element 10 includes a first electroconductive type of contact portion 270, a first electroconductive type of photoelectric conversion region 260, and a second electroconductive type of photoelectric conversion region 250 which is stacked on the upper side and the lower side of the first electroconductive type of photoelectric conversion region 260 and has an electroconductive type reverse to the first electroconductive type. The first electroconductive type of contact portion 270 is connected to the base of the first bipolar transistor 110. The first electroconductive type of photoelectric conversion region 260 is connected to the first electroconductive type of contact portion 270. A plurality of the contact portions 270 of the first electroconductive type is provided.

As is illustrated in FIG. 7, the first electroconductive type of contact portions 270 are provided in the first electroconductive type of photoelectric conversion region 260 so as to form a plurality of lines and a plurality of rows, and are arranged so that the pitch C among a plurality of the lines in the line direction and a pitch B among a plurality of the rows in the row direction become approximately 1:1.

In addition, the first electroconductive type of contact portions 270 which are provided so as to form the plurality of lines and the plurality of rows are arranged so that distances D and E between a row of the first electroconductive type of contact portions 270 arranged in the outermost periphery of the matrix and an end of the first electroconductive type of photoelectric conversion region 260 can be approximately a half of the pitch B in the row direction. The first electroconductive type of contact portions 270 which are provided so as to form the plurality of lines and the plurality of rows are arranged so that distances F and G between a line of the first electroconductive type contact portion 270 arranged in the outermost periphery of the matrix and an end of the first electroconductive type of photoelectric conversion region 260 are approximately a half of the pitch C in the line direction.

In the photoelectric conversion apparatus of FIG. 9, a second photoelectric conversion element 11 generates an electric current by photoelectric conversion. A second current amplifying element 111 amplifies the electric current generated in the second photoelectric conversion element 11. Second detecting units 121 and 131 detect a reverse bias voltage value of the second photoelectric conversion element 11. A second setting unit 141 sets a reverse bias voltage value of the second photoelectric conversion element 11 at a second normal value based on a detected result of the second detecting units 121 and 131. The second normal value is larger than a depleting voltage of the second photoelectric conversion element 11.

The second current amplifying element 111 includes a second bipolar transistor which connects the second photoelectric conversion element 11 to the way between its collector and base, and outputs an amplified electric current from its emitter. The second detecting units 121 and 131 include a third field effect transistor, and a second constant current source, respectively, which is connected to the third field effect transistor. The third field effect transistor has its gate connected to the base of the second bipolar transistor, and its source connected to the collector of the second bipolar transistor. The second setting unit 141 includes a fourth field effect transistor having the same polarity as the third field effect transistor. The fourth field effect transistor has its source connected to the emitter of the second bipolar transistor, has its gate connected to the drain of the third field effect transistor, and outputs an electric current amplified by the second bipolar transistor from its drain. The voltage between the gate and the source of the third field effect transistor is larger than a depleting voltage of the second photoelectric conversion element 11.

The first photoelectric conversion element 10 and the second photoelectric conversion element 11 include a stacked region in which a plurality of the first electroconductive type of photoelectric conversion regions 260 and 261, and a plurality of the second electroconductive type of photoelectric conversion regions 250 and 251 which have an electroconductive type reverse to the first electroconductive type are alternately stacked. The first photoelectric conversion element 10 includes a combination of stacked layers in which the first electroconductive type of photoelectric conversion region 260 and the second electroconductive type photoelectric conversion region 250 are stacked. The second photoelectric conversion element 11 includes another combination of stacked layers in which the first electroconductive type of photoelectric conversion region 261 and the second electroconductive type of photoelectric conversion region 251 are stacked.

The reverse bias voltage of the first photoelectric conversion element 10 formed in a deeper position from the surface than the second photoelectric conversion element 11 is larger than that of the second photoelectric conversion element 11 formed in a shallower position from the surface than the first photoelectric conversion element 10.

In the photoelectric conversion apparatus of FIG. 10 and FIG. 11, the first photoelectric conversion element 10 is connected to the base of the first bipolar transistor 110 through the first electroconductive type of first contact portion 270. The second photoelectric conversion element 11 is connected to the base of the second bipolar transistor 111 through the first electroconductive type of second contact portion 271. The first contact portions 270 and the second contact portions 271 are provided respectively in the respective first electroconductive type of photoelectric conversion regions 260 and 261 so as to form a plurality of lines and a plurality of rows, and are arranged so that the pitch among the plurality of lines in the line direction and a pitch among the plurality of rows in the row direction can be approximately 1:1.

As is illustrated in FIG. 11, the first contact portions 270 provided so as to form the plurality of lines and the plurality of rows and the second contact portions 271 provided so as to form the plurality of lines and the plurality of rows are connected by comb-shaped metal wires 290 and 291, and are arranged so as to be telescopic with respect to each other.

In the photoelectric conversion apparatus of FIG. 12, the first contact portion 270 is connected to the first photoelectric conversion element 10 which is formed in a deeper position from the surface than the second photoelectric conversion element 11. The second contact portion 271 is connected to the second photoelectric conversion element 11 which is formed in a shallower position from the surface than the first photoelectric conversion element 10. The number of the first contact portions 270 is smaller than that of the second contact portions 271.

The first to seventh embodiments can provide a photoelectric conversion apparatus which inhibits the variation of a parasitic capacitance of photoelectric conversion elements 10 and/or 11 according to the operating state to maintain a state in which the parasitic capacitance is small, and thereby can provide a state in which the photoresponsibility is stably satisfactory.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-330804, filed Dec. 25, 2008, which is hereby incorporated by reference herein in its entirety.

What is claimed is:

1. A photoelectric conversion apparatus comprising:
  a first photoelectric conversion element configured to generate a current by a photoelectric conversion;
  a first current amplifying element configured to amplify the current generated by the first photoelectric conversion element;
  a first detecting unit configured to detect a reverse bias voltage value of the first photoelectric conversion element; and
  a first setting unit configured to set the reverse bias voltage value of the first photoelectric conversion element at a first normal value based on a result of the detection by the first detecting unit, wherein
  the first normal value is larger than a depleting voltage of the first photoelectric conversion element.

2. The photoelectric conversion apparatus according to claim 1, wherein
  the first current amplifying element includes a first bipolar transistor connected such that the first photoelectric conversion element is connected between a collector and a base of the first bipolar transistor to output an amplified current from an emitter of the first bipolar transistor,
  the first detecting unit includes a first field effect transistor having a gate connected to the base of the first bipolar transistor and having a source connected to the collector of the first bipolar transistor, and includes a first constant current source connected to the first field effect transistor,
  the first setting unit includes a second field effect transistor having the same polarity as that of the first field effect transistor, having a source connected to an emitter of the first bipolar transistor, having a gate connected to a drain of the first bipolar transistor, and having a drain outputting the current amplified by the first bipolar transistor, and
  a voltage between the gate and the source of the first field effect transistor is larger than a voltage for depleting the first photoelectric conversion element.

3. The photoelectric conversion apparatus according to claim 2, further comprising:
  a threshold detecting unit configured to detect a threshold voltage of a field effect transistor of the same polarity as the first field effect transistor; and
  a threshold feed-back unit configured to control a current value of the first constant current source, based on a result of the detection by the threshold detecting unit.

4. The photoelectric conversion apparatus according to claim 3, wherein
  the first constant current source includes a third field effect transistor having a drain connected to the drain of the first field effect transistor, and a fourth field effect transistor having a gate and a drain connected mutually at a node connected to a gate of the third field effect transistor and having a source connected to a source of the third field effect transistor, and
  the threshold detecting unit, or the threshold feed-back unit includes a fifth field effect transistor having a gate and a drain connected mutually at a node connected to the gate of the fourth field effect transistor and having a source connected to a constant voltage node.

5. The photoelectric conversion apparatus according to claim 2, further comprising
  a depleting voltage detecting unit configured to detect a depleting voltage of the first photoelectric conversion element; and
  a depleting voltage feed-back unit configured to control a current value of the first constant current source, based on a result of the detection by the depleting voltage detecting unit.

6. The photoelectric conversion apparatus according to claim 2, wherein the first photoelectric conversion element includes:
  a contact portion of a first conductivity type connected to the base of the first bipolar transistor;
  a photoelectric conversion region of the first conductivity type connected to the contact portion of a first conductivity type;
  a region of a second conductivity type opposite to the first conductivity type arranged above and below the photoelectric conversion region of the first conductivity type; and
  a plurality of the contact portions of the first conductivity type.

7. The photoelectric conversion apparatus according to claim 6, wherein the plurality of the contact portions of the first conductivity type are arranged along a plurality of rows and columns in the photoelectric conversion region of the first conductivity type, such that the ratio of the pitch in the row direction to the pitch in the column direction is 1:1.

8. The photoelectric conversion apparatus according to claim 7, wherein the plurality of the contact portions of the first conductivity type are arranged such that the distance between the most outside one of the columns and an end of the photoelectric conversion region of the first conductivity type is a half of the pitch in the column direction.

9. The photoelectric conversion apparatus according to claim 2, further comprising:
a second photoelectric conversion element configured to generate a current by photoelectric conversion;
a second current amplifying element configured to amplify the current generated by the second photoelectric conversion element;
a second detecting unit configured to detect a reverse bias voltage value of the second photoelectric conversion element; and
a second setting unit configured to set the reverse bias voltage value of the second photoelectric conversion element at a second normal value based on a result of the detection by the second detecting unit, wherein
the second normal value is larger than a depleting voltage of the second photoelectric conversion element,
the second current amplifying element includes a second bipolar transistor connected such that the second photoelectric conversion element is connected between a collector and a base of the second bipolar transistor to output an amplified current from an emitter of the second bipolar transistor,
the second detecting unit includes a third field effect transistor having a gate connected to the base of the second bipolar transistor and having a source connected to the collector of the second bipolar transistor, and also includes a second constant current source connected to the third field effect transistor,
the second setting unit includes a fourth field effect transistor having the same polarity as that of the third field effect transistor, having a source connected to emitter of the second bipolar transistor, having a gate connected to a drain of the third bipolar transistor, and having a drain outputting the current amplified by the second bipolar transistor,
the voltage between the gate and the source of the third field effect transistor is larger than a voltage for depleting the second photoelectric conversion element,
the first and second photoelectric conversion elements comprise a stacked region wherein a photoelectric conversion region of the first conductivity type and a region of a second conductivity type opposite to the first conductivity type are laminated alternatingly,
the first photoelectric conversion element comprises a stacked layer including a set of the photoelectric conversion region of the first conductivity type and the region of the second conductivity type, and
the second photoelectric conversion element comprises a stacked layer including another set of the photoelectric conversion region of the first conductivity type and the region of the second conductivity type.

10. The photoelectric conversion apparatus according to claim 9, wherein the reverse bias voltage of the first photoelectric conversion element formed in a position deeper, with regard to a surface of the photoelectric conversion apparatus, than a position in which the second photoelectric conversion element is formed, is larger than the reverse bias voltage of the second photoelectric conversion element.

11. The photoelectric conversion apparatus according to claim 9, wherein
the first photoelectric conversion element is connected through a first contact portion of the first conductivity type to the base of the first bipolar transistor,
the second photoelectric conversion element is connected through a second contact portion of the first conductivity type to the base of the second bipolar transistor, and
a plurality of first contact portions and a plurality of the second contact portions are formed in a plurality of rows and columns respectively in the photoelectric conversion region of the first conductivity type, such that a ratio of a pitch in the row direction to a pitch in the column direction is 1:1.

12. The photoelectric conversion apparatus according to claim 11, wherein the first contact portions arranged in rows and columns, and the second contact portions arranged in rows and columns are respectively connected through a metal wiring of a comb shape, and are arranged in a telescopic configuration.

13. The photoelectric conversion apparatus according to claim 11, wherein the number of the first contact portions connected to the first photoelectric conversion element formed in a position deeper, with regard to a surface of the photoelectric conversion apparatus, than a position of the second photoelectric conversion element, is smaller than the number of the second contact portions connected to the second photoelectric conversion element.

14. The photoelectric conversion apparatus according to claim 12, wherein the number of the first contact portions connected to the first photoelectric conversion element formed in a position deeper, with regard to a surface of the photoelectric conversion apparatus, than a position of the second photoelectric conversion element, is smaller than the number of the second contact portions connected to the second photoelectric conversion element.

15. A driving method of a photoelectric conversion apparatus including a photoelectric conversion element configured to generate a current by a photoelectric conversion and a current amplifying element configured to amplify the current generated by the photoelectric conversion element, said method comprising the steps of:
detecting a reverse bias voltage value of the photoelectric conversion element; and
setting the reverse bias voltage value of the photoelectric conversion element to be larger than a depleting voltage value of the photoelectric conversion element.

16. The driving method of the photoelectric conversion apparatus according to claim 15, wherein the photoelectric conversion apparatus further includes a field effect transistor configured to detect a reverse bias voltage value of the photoelectric conversion element, and a current source configured to drive the field effect transistor, said driving method further comprising the step of:
setting the reverse bias voltage value of the photoelectric conversion element to satisfy following expression:

$$V_{th} + \sqrt{\frac{2I_{pix}}{\beta}} > VDEP,$$

wherein $V_{th}$ is a threshold voltage of the field effect transistor,
$I_{pix}$ is a current value of the current source,
VDEP is the depleting voltage value of the photoelectric conversion element, and
$\beta$ is defined by the following expression:

$$\beta = \mu_0 C_{ox}(W/L),$$

wherein $\mu_0$ is a mobility of a carrier,
$C_{ox}$ is a gate capacitance per unit area of the field effect transistor,
W is a gate width of the field effect transistor, and
L is a gate length of the field effect transistor.

17. The driving method of the photoelectric conversion apparatus according to claim 15, wherein the photoelectric conversion apparatus further includes a field effect transistor configured to detect a reverse bias voltage value of the photoelectric conversion element, and a current source configured to drive the field effect transistor, and wherein said driving method further comprising steps of:

detecting a threshold voltage of the field effect transistor; and controlling a current value of the current source, based on a result of detecting the threshold voltage of the field effect transistor.

18. The driving method of the photoelectric conversion apparatus according to claim 15, wherein the photoelectric conversion apparatus further includes a field effect transistor configured to detect a reverse bias voltage value of the photoelectric conversion element, and a current source configured to drive the field effect transistor, and wherein said driving method further comprising steps of:

detecting the depleting voltage of the photoelectric conversion element; and controlling a current value of the current source, based on a result of detecting the depleting voltage of the photoelectric conversion element.

* * * * *